United States Patent [19]
Eddlemon

[11] Patent Number: 5,519,357
[45] Date of Patent: May 21, 1996

[54] BIASING ARRANGEMENT FOR A QUASI-COMPLEMENTARY OUTPUT STAGE

[75] Inventor: Dennis N. Eddlemon, Tucson, Ariz.

[73] Assignee: Apex Microtechnology, Tucson, Ariz.

[21] Appl. No.: 391,353

[22] Filed: Feb. 21, 1995

[51] Int. Cl.$^6$ ................................ H03F 3/26; H03F 3/16
[52] U.S. Cl. ............................................. 330/264; 330/269
[58] Field of Search ...................... 330/264, 267, 330/268, 269, 273, 274

[56] References Cited

U.S. PATENT DOCUMENTS

| | | | |
|---|---|---|---|
| 4,524,328 | 6/1985 | Abou et al. | 330/269 X |
| 5,363,063 | 11/1994 | Laot et al. | 330/264 X |

*Primary Examiner*—Steven Mottola
*Attorney, Agent, or Firm*—Benman, Collins & Sawyer

[57] ABSTRACT

A biasing arrangement for a quasi-complementary output stage having first and second transistors of a first type, where at least one of the transistors is driven by a third transistor of a second type. The inventive biasing arrangement comprises a first circuit for biasing the third transistor and a second circuit having a third circuit for providing an input signal to the first transistor and a fourth circuit for providing the input signal to the first circuit. In a particular implementation, the first circuit is connected between the input terminals of the first and the third transistors. The third circuit is a fourth transistor having a first terminal connected to a first source of supply, a second terminal connected to a source of the input signal and a third terminal connected to a second source of supply. The third terminal of the fourth transistor is connected to the second source of supply via a first resistor. The fourth circuit is a fifth transistor having a first terminal connected to an input terminal of the third transistor, a second terminal connected to the source of the input signal, and a third terminal connected to the third terminal of the fourth transistor. The inventive arrangement provides a symmetrical output signal with a bias that is stable with temperature.

16 Claims, 1 Drawing Sheet

BIASING ARRANGEMENT FOR A QUASI-COMPLEMENTARY OUTPUT STAGE

BACKGROUND OF THE INVENTION

1. Field of the Invention

The present invention relates to analog electronic circuits and systems. More specifically, the present invention relates to power amplifiers and the like.

2. Description of the Related Art

In the fabrication of electronic circuits, particularly monolithic integrated circuits, there is often a need for complementary output devices. Complementary output devices are transistor devices fabricated in accordance with complementary technologies such as n-channel and p-channel devices in metal-oxide semiconductor field effect transistor (MOSFET) technology and npn and pnp transistors in bipolar technology. The use of complementary output devices substantially simplifies the biasing required for the output devices. This is particularly important where circuit size, complexity and power output are significant design considerations such as monolithic power amplifiers.

Unfortunately, it is very difficult to fabricate monolithic n-channel and p-channel devices having similar operating characteristics on the same substrate. The technology favors n-channel devices as these can be made smaller for the same voltage and current ratings. (In bipolar technology, the same principles generally hold for pnp as compared to npn technologies.)

Accordingly, in the design of circuits where complementary power devices would be of benefit, conventional wisdom is to wrap a small p-channel device around a larger n-channel device. The combination in many respects operates like a large n-channel device. Unfortunately, it is very difficult to produce a stable bias in such arrangements using conventional biasing techniques. For example, in many applications, such as monolithic power operational amplifier integrated circuits, such conventional bias techniques typically produce asymmetrical output signals, unstable quiescent current over temperature, and high output impedance, as well as distortion, overload recovery problems, overshoot and other nonlinearities.

Thus, there is a need in the art for an improved compound output stage. More specifically, there is a need in the art for a system and technique for biasing the output stage of a monolithic power amplifier in which a small p-channel device may be used to drive a larger n-channel device tied to a source of negative supply to provide a symmetrical alternating current (AC) output with control of the quiescent current in same.

SUMMARY OF THE INVENTION

The need in the art is addressed by the present invention which provides a biasing arrangement for an output stage having first and second transistors of a first type, where at least one of the transistors is driven by a third transistor of a second type. The inventive biasing arrangement comprises a first circuit for biasing the third transistor and a second circuit having a third circuit for providing a signal to the first transistor and a fourth circuit for providing an input signal to the first circuit.

In a particular implementation, the first circuit is connected between the input terminals of the first and the third transistors. The third circuit is a fourth transistor having a first terminal connected to a first source of supply, a second terminal connected to a source of the input signal and a third terminal connected to a second source of supply. The third terminal of the fourth transistor is connected to the second source of supply via a first resistor. The fourth circuit is a fifth transistor having a first terminal connected to an input terminal of the third transistor, a second terminal connected to the source of the input signal, and a third terminal connected to the third terminal of the fourth transistor.

The inventive arrangement provides a symmetrical output signal with a stable bias point over temperature.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
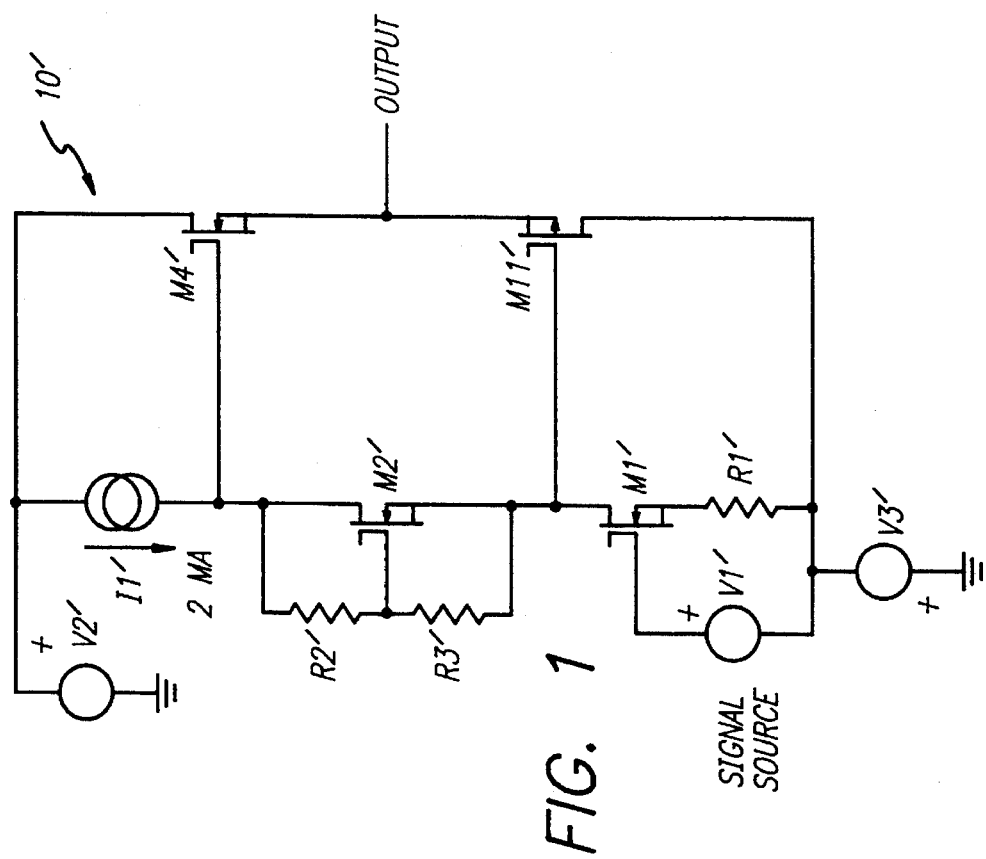
FIG. 1 is a schematic diagram of an ideal output stage for a monolithic power amplifier that might be possible if large geometry monolithic P channel MOSFETS were available.

FIG. 1 is a schematic diagram of an ideal output stage for a monolithic power amplifier that might be possible if large geometry monolithic P channel MOSFETS were available. The stage 10' includes a source of an input signal VI' connected between the negative terminal of a first source of supply voltage V3' and the gate of a first n-channel MOSFET M1'. The first n-channel MOSFET is an amplifier. The source of the input signal may be the first stage of an operational power amplifier. The second terminal of the source V3' is connected to ground. The source of the first transistor M1' is connected to the negative terminal of the source V3' via a resistor R1'. The drain terminal of the first transistor M1' is connected to a current source I1' via a second n-channel MOSFET M2'. I1' appears to M1' as a load. Since I1' is a current source, its impedance is high. Accordingly, the voltage gain of M1' is high. The source of the second n-channel MOSFET is connected to the drain of the first n-channel MOSFET M1' and the drain of the second n-channel MOSFET M2' is connected to the current source I1' The second terminal of the current source I1' is connected to the positive terminal of a second voltage source V2'. The second terminal of the second voltage source V2' is connected to ground. The second n-channel MOSFET M2' is biased by second and third resistors R2' and R3' which are connected between the drain and gate and gate and source terminals, respectively, of the second n-channel MOSFET M2'. M2', R2' and R3' provide a VGS multiplier as is well known in the art. The drain terminal of the first transistor M1' is connected to the gate terminal of a p-channel MOSFET M11'. The drain terminal of the p-channel MOSFET M11' is connected to the negative terminal of the first voltage source V3'. The source terminal of the first p-channel MOSFET M11' is connected to the source terminal of the third n-channel MOSFET M4'. This node provides the output terminal for the stage 10'. The drain terminal of the third n-channel MOSFET M4' is connected to the positive terminal of the second voltage source V2'.

The purpose of M2' is to produce a voltage between the drain to source which is applied as a bias current to the gate terminals of the output transistors M4' and M11'. As a result, a current would always be flowing through M4' and M11' so that when the output swings between positive polarity and negative polarity cross-over distortion is avoided.

Unfortunately, it is not currently practical to fabricate large, monolithic high current capacity, p-channel MOSFETS such as M11'. Accordingly, there has been a need in the art for a system and technique to use a large n-channel MOSFET to serve the same function as M11'.

Figure 2:
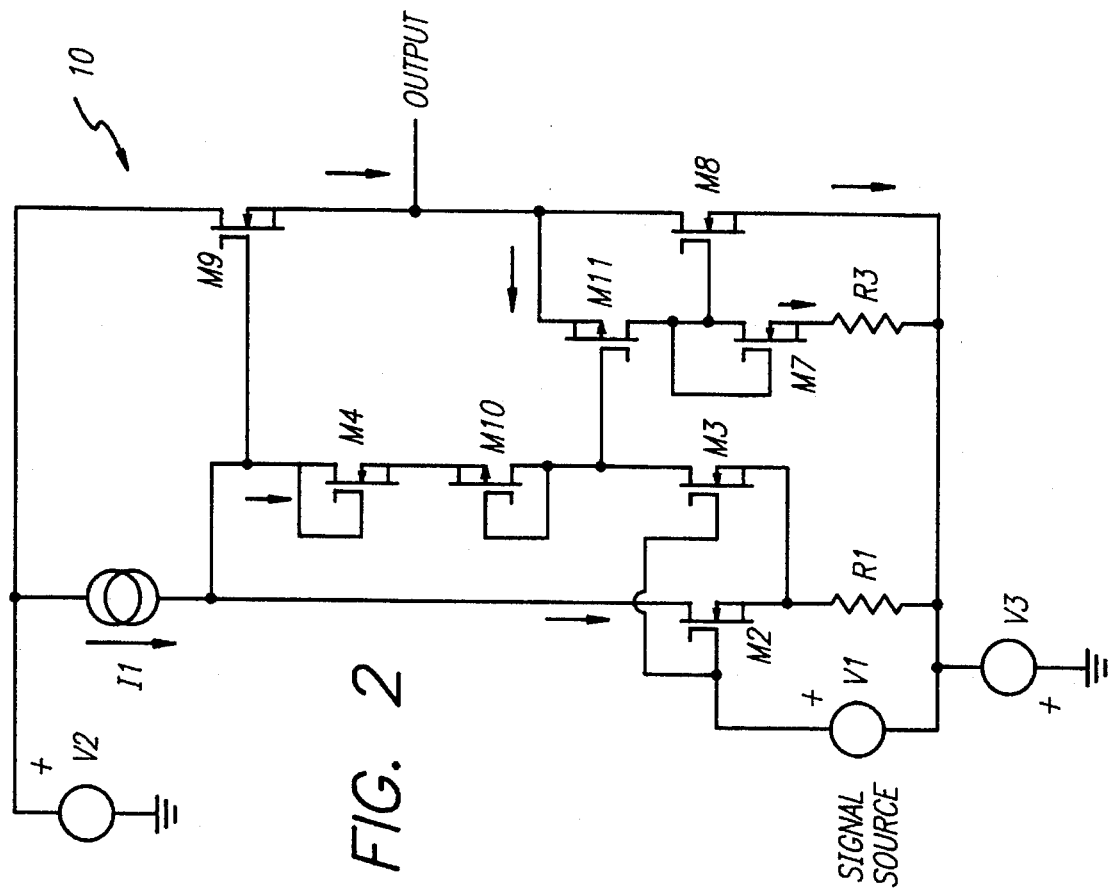
FIG. 2 is a schematic diagram of the power amplifier output stage of the present invention.

FIG. 2 is a schematic diagram of the power amplifier output stage of the present invention. The present invention provides a small p-channel device which drives a larger n-channel device tied to a source of negative supply to provide a symmetrical alternating current (AC) output with control of the quiescent current in same. As in FIG. 1, the voltage source V1 represents the signal source. If an entire operational amplifier circuit were drawn, the signal would come from the output of the first stage of the amplifier and would be appropriately level shifted to appear across the gate-source circuit of M2 as V1 is connected.

The amplifier M1' of FIG. 1 is replaced by the split amplifiers M2 and M3. Thus, amplification is provided by the current source I1, and the combination of M2 and M3. It can be seen that the gate-source circuits of M2 and M3 are in parallel. In this design, M2 and M3 are geometrically ratioed so that M2 will conduct 9 times the drain current of M3 for the same drive signal. Thus, if the current source I1 supplies 2 milliamps of current, then M2 will carry 1.8 milliamps and M3 will carry 0.2 milliamps.

The output MOSFETS are M8 and M9. In the illustrative embodiment, both of these devices are large geometry n-channel devices and composed of approximately 3000 cells. M11 is a small, p-channel device. M2 provides an input signal to M9 and M3 provides an input signal to M8 via M11. M4 and M10 bias M11 and M9.

Two circuits are responsible for biasing the output stage and stabilizing that bias current over temperature. The first circuit comprises M7 and R3 which appear across the gate and source terminals of M8. In the illustrative embodiment, M7 is a 60 cell MOSFET identical to the cells that comprise M8. M7 is connected as a diode which develops a voltage equivalent to its threshold voltage plus any voltage developed by the flow of current from the drain of M11. As temperature varies, the voltage across M7 will change in the same way that the gate-source voltage of M8 varies due to the fact that both M8 and M7 are made front identical cells. In the illustrative embodiment, the ratio of currents in M8 to M7 under bias conditions is 50 to 1. Thus, if 0.2 milliamps flows from M11 to M7, then approximately 10 milliamps flows in MS. R3 is a signal developing resistor.

The second circuit responsible for a temperature stable bias current is comprised of M4 and M10. M4 is a diode connected n-channel MOSFET. M10 is a diode connected p-channel MOSFET. The series string of M4 and M10 are in parallel with the gate-source circuits of M9 and M11. In the illustrative embodiment, M4 is made of 60 cells that are identical to the cells that make up M9. In the illustrative embodiment, the ratio of the cells in M9 to that in M11 is 50:1. Hence, the current in M9 will be 50 times the current in M4. M10 is identical to M11 and so the amount of current that is in M10 will flow in M11. Accordingly, two circuits determine the quiescent current in the output MOSFETs: the M9, M4 cell ratio of 50:1 and the M8, M7 cell ratio also of 50:1. These pairs of MOSFETS serve as current mirrors.

The dividing of the single stage amplifier M1' of FIG. 1 into a split configuration comprising M2 and M3 in FIG. 2 provides a further benefit. The capacitance of M9 is large. The capacitance of M11 is quite small. During positive going slew limiting conditions, the full current of the source I1 is available to charge the capacitance of M9. A small amount of that current goes into M11 to turn it off. During negative going slew limiting M2 supplies the current to turn off M9. However, the current available would turn on M11 long before M9 could ever turn off and a large current would flow from the supply rail through M9 and M8. With the splitting of the amplifier M1' into M2 and M3, the amplifier M2 can still provide large currents to drive M9 but only one tenth of that current is available to drive M11 via M3. This provides a much more symmetrical drive to output stage MOSFETs and avoids the cross-conduction through M9 and M8.

The split amplifier combination of M2 and M3 provides both high and low current paths to drive the asymmetric output stage. The asymmetric mirror in the low current path provides a 1:1 mirror with M10 and M11 while at the same time provides a 50:1 current mirror with M9 and M4 in the illustrative embodiment. The resulting stabilized current in M11 is then used to provide a stabilized current in the M7, M8 current mirror.

Thus, a design for a compound stage with an n-channel MOSFET is provided to supply large negative output currents with a bias current that is stable with temperature. The stable bias current reduces crossover distortion and eliminates possible thermal runaway in the bias current through M8 and M9.

Thus, the present invention has been described herein with reference to a particular embodiment for a particular application. Those having ordinary skill in the art and access to the present teachings will recognize additional modifications applications and embodiments within the scope thereof The invention is not limited to the biasing arrangements shown. Other biasing arrangements, and proportional transistor sizes may be utilized within the scope to the present invention.

It is therefore intended by the appended claims to cover any and all such applications, modifications and embodiments within the scope of the present invention.

Accordingly,

What is claimed is:

1. A biasing arrangement for a quasi-complementary output stage having first and second transistors of a first type, at least one of said transistors being driven by a third transistor of a second type, said biasing arrangement comprising:

first means for biasing said third transistor and second means having a third means for providing a first signal to said first transistor and a fourth means for providing an input signal to said first means; wherein said third means is a fourth transistor having a first terminal connected to a first source of supply, a second terminal connected to a source of said input signal and a third terminal connected to a second source of supply and said fourth transistor is connected to said second source of supply via a first resistor.

2. The invention of claim 1 wherein said fourth means is a fifth transistor having a first terminal connected to an input terminal of said third transistor, a second terminal connected to said source of said input signal, and a third terminal connected to the third terminal of said fourth transistor.

3. The invention of claim 1 wherein said first means is connected between input terminals of said first and said third transistors.

4. The invention of claim 3 wherein said first means includes first and second diodes connected in series.

5. The invention of claim 4 further including a third diode connected between a control terminal of said second transistor and said second source of supply.

6. An output stage comprising:
   first and second transistors of a first type, at least one of said transistors being driven by a third transistor of a second type and
   a biasing arrangement comprising:
      first means for biasing said third transistor and
      second means having a third means for providing a first signal to said first transistor and a fourth means for providing an input signal to said first means; wherein said third means is a fourth transistor having a first terminal connected to a first source of supply, a second terminal connected to a source of said input signal and a third terminal connected to a second source of supply and said fourth transistor is connected to said second source of supply via a first resistor.

7. The invention of claim 6 wherein said fourth means is a fifth transistor having a first terminal connected to an input terminal of said third transistor, a second terminal connected to said source of said input signal, and a third terminal connected to the third terminal of said fourth transistor.

8. The invention of claim 6 wherein said first means is connected between input terminals of said first and said third transistors.

9. The invention of claim 8 wherein said first means includes first and second diodes connected in series.

10. The invention of claim 9 further including a third diode connected between a control terminal of said second transistor and said second source of supply.

11. An output stage comprising:
    first and second output transistors of a first type;
    a third transistor of a second type for driving said second transistor; and
    means for providing a first current path with a first current carrying capacity and a first voltage gain for driving said first transistor; and
    means for providing a second current path, parallel to said first current path, said second current path having a second current carrying capacity and said first voltage gain for driving said third transistor.

12. The invention of claim 11 wherein said means for providing a first current path includes a fourth transistor of said first type connected between an input terminal of said first transistor and a source of supply potential.

13. The invention of claim 12 wherein said means for providing a second current path includes a fifth transistor of said first type connected between an input terminal of said third transistor and said source of supply potential.

14. The invention of claim 13 including means disposed in said second path between the input terminal of said first transistor and the input terminal of said third transistor for biasing said third transistor.

15. The invention of claim 14 wherein said means for biasing said third transistor includes a sixth transistor of said first type and a seventh transistor of said second type, said sixth transistor being connected as a diode to the input terminal said first transistor and to said seventh transistor and said seventh transistor being connected as a diode between said sixth transistor and the input terminal of said third transistor.

16. The invention of claim 11 including means connected to said third transistor for biasing said second transistor.

* * * * *